United States Patent [19]

Duchemin et al.

[11] 4,220,488

[45] Sep. 2, 1980

[54] GAS-PHASE PROCESS FOR THE PRODUCTION OF AN EPITAXIAL LAYER OF INDUM PHOSPHIDE

[75] Inventors: Jean-Pascal Duchemin; Daniel Leguen; Michel Bonnet; Francois Koelsch; Gerard Beuchet, all of Paris, France

[73] Assignee: Thomson-CSF, Paris, France

[21] Appl. No.: 17,969

[22] Filed: Mar. 6, 1979

[30] Foreign Application Priority Data

Mar. 7, 1978 [FR] France .................................. 78 06432

[51] Int. Cl.² .................. H01L 21/205; H01L 21/365
[52] U.S. Cl. ..................................... 148/175; 118/719; 148/1.5; 148/174; 156/610; 156/613; 156/614; 252/62.3 GA; 357/61; 427/87
[58] Field of Search ........................ 148/1.5, 174, 175; 252/62.3 GA; 156/610, 613, 614; 427/87; 118/49.5; 357/61

[56] References Cited

U.S. PATENT DOCUMENTS

| | | | |
|---|---|---|---|
| 3,364,084 | 1/1968 | Ruehrwein | 148/175 |
| 3,421,952 | 1/1969 | Conrad et al. | 148/175 |
| 3,617,371 | 11/1971 | Burmeister | 118/49.5 X |
| 3,867,202 | 2/1975 | Ichiki et al. | 148/175 |

FOREIGN PATENT DOCUMENTS

1319559 6/1973 United Kingdom ..................... 156/614

OTHER PUBLICATIONS

Tietjen et al., "Preparation. . . Epitaxial $I_mAc_{1-x}P_x$ using. . . phosphine" J. Electrochem. Soc., vol. 116, No. 4, Apr. 1969, pp. 492–494.

Allen, H. A., "Orientation Dependence of Epitaxial $I_mAa_xP_{1-x}$ on GaAs".
Ibid., vol. 117, No. 11, Nov. 1970, pp. 1417–1419.
Tietjen et al., "Vapor-Phase Growth of Several III-V. . . Semiconductors" Solid State Technology, Oct. 1972, pp. 42–49.
Seki et al., "New Vapor Growth Method for Gap. . ." Japanese J. Appl. Phys., vol. 12 (1973), No. 7, pp. 1112–1113.

Primary Examiner—L. Dewayne Rutledge
Assistant Examiner—W. G. Saba
Attorney, Agent, or Firm—Oblon, Fisher, Spivak, McClelland & Maier

[57] ABSTRACT

A process and an apparatus for epitaxy in a gaseous phase, producing thin and homogeneous layers of monocrystalline indium phosphide. The process comprises two steps. In the first step, the phosphine is decomposed in a pyrolysis chamber which extends through a kiln in accordance with the reaction:

$$4 PH_3 \xrightarrow[1/10 \text{ at}]{700° C.} P_4 + 6 H_2$$

Thereafter, in a second step, the phosphorus is reacted with triethylindium in an atmosphere of hydrogen and nitrogen:

$$3/2 H_2 + \tfrac{1}{4} P_4 + In(C_2H_5)_3 \xrightarrow[1/10 \text{ at}]{500° C.} In P + 3 C_2H_6.$$

The residual gases are drawn off by a vacuum pump.

6 Claims, 1 Drawing Figure

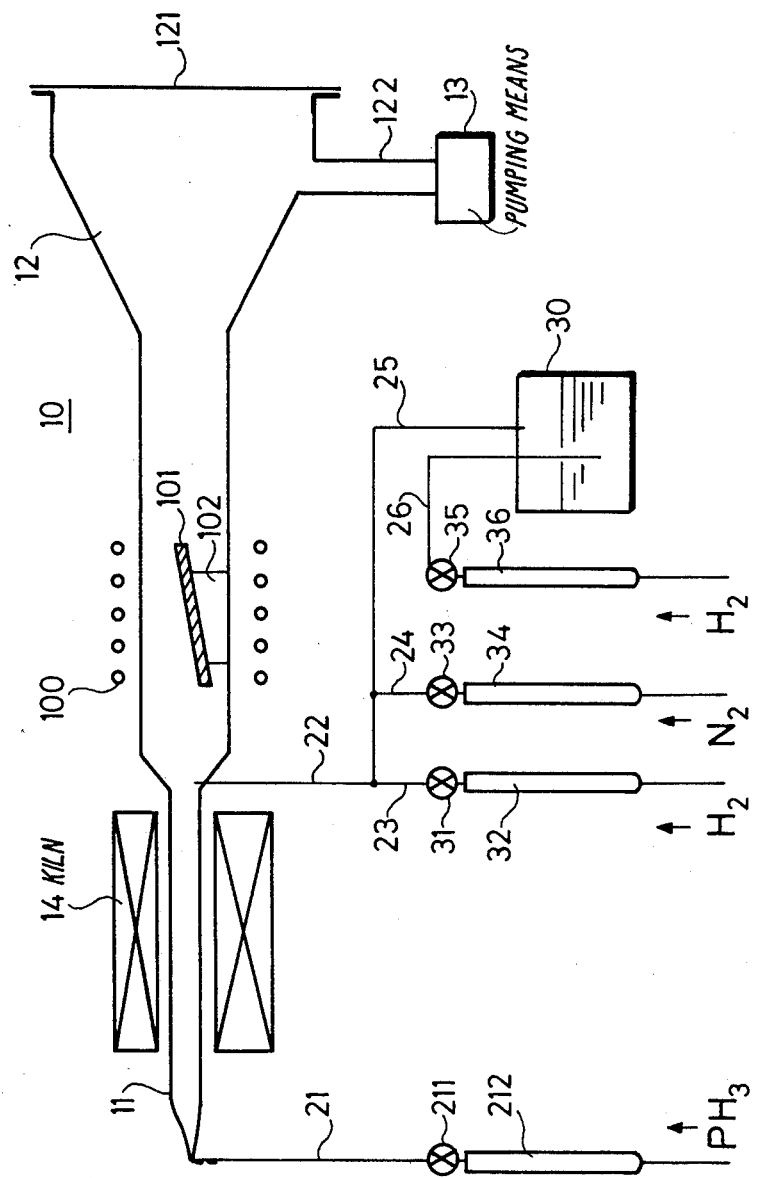

GAS-PHASE PROCESS FOR THE PRODUCTION OF AN EPITAXIAL LAYER OF INDUM PHOSPHIDE

BACKGROUND OF THE INVENTION

Field of the Invention

The invention relates to a process for obtaining, in a gaseous phase, epitaxial layers of monocrystalline indium phosphide for the purpose of producing semiconductor devices.

Description of the Prior Art

It is known that this type of process, in particular in a reactor, termed a "horizontal" reactor, operating at low pressure (76 Torrs), permits the obtainment of epitaxial layers of monocrystalline semiconductors having excellent qualities for very small thickness, of the order of 2000 Angstroms, and of relatively large areas up to several square centimeters.

The suitably doped monocrystalline indium phosphide is particularly recommended for producing diodes of the Gunn type of higher power and higher efficiency than those obtained with gallium arsenide. Likewise, there are advantages in using indium phosphide for very high frequency and high gain field effect transistors and for electro-optical devices such as laser diodes and photo-diodes.

However, the obtainment of indium phosphide by epitaxy in a gaseous phase encounters a serious difficulty when it is attempted in particular to operate in a manner similar to the epitaxy of gallium arsenide. Indeed, if there is employed a combination reaction of an organo-metallic compound (triethyl indium in the present case) with a hydrogenated compound (phosphine in the present case) according to the diagram:

$$In(C_2H_5)_3 + PH_3 \rightarrow In\ P + C_2H_6 \quad (1)$$

Indeed, the following parasitic reaction occurs:

$$In(C_2H_5)_3 + PH_3 \rightarrow H_3P\ In(C_2H_5)_3 \quad (2)$$

Indeed, as the reaction (1) is slower than the reaction (2) and the addition compound resulting from the reaction (2) is particularly stable, the reaction (1) practically does not occur. The formation of this particularly stable compound is explained by the fact that the indium has a vacancy of electrons whereas the phosphorus has a nonbinding doublet which promotes the formation of an addition compound at the cost of the formation of In P.

The invention aims at overcoming these difficulties.

SUMMARY OF THE INVENTION

According to the invention, there is provided a process for producing in a gaseous phase an epitaxial layer of indium phosphide, comprising the following steps:

(a) formation of phosphorus vapour by pyrolysis of phosphine in a gaseous phase at a temperature of 700° C. to 1000° C., according to the diagram $$4\ PH_3 \rightarrow P_4 + 6H_2$$

(b) reaction of the phosphorus vapour, in an atmosphere containing nitrogen and hydrogen with triethyl indium, in the presence of a substrate of monocrystalline In P, according to the diagram:

$$3/2\ H_2 + \tfrac{1}{4}P_4 + In(C_2H_5)_3 \rightarrow In\ P + 3C_2H_6$$

at a temperature of 350° to 700° C.

According to another feature of the invention, the aforementioned steps occur at a pressure which is low relative to atmospheric pressure, namely between 10 Torrs and atmospheric pressure, and preferably at 76 Torrs or in the range of 70 to 80 Torrs.

DETAILED DESCRIPTION OF THE PREFERRED EMBODIMENTS

A better understanding of the invention will be had, and other features will appear, from the ensuing description with reference to the single FIGURE which shows diagrammatically an apparatus for carrying out the process according to the invention.

The successive reactions occur in a gaseous phase, the gases passing in succession through the component parts of a reactor 10 (single feature). These parts are the following:

a tubular pyrolysis chamber 11 of glass of the "quartz" type inserted in a kiln 14;

an epitaxy chamber 12 comprising a cylinder, a flared portion closed by a removable door 121 and an outlet 122 leading to means 13 for pumping the gases.

The kiln 14 is capable of causing a temperature of 700° C. to 1000° C. to prevail in the tube 11 which extends through the kiln, which causes the decomposition of the phosphine. The optimum temperature is about 750° C.

The cylindrical part of the epitaxy chamber 12 has its axis in the extension of the pyrolysis tube 11 which promotes the rapid circulation of the gases. This part is surrounded, over a length slightly greater than that of the epitaxy zone proper, by a high-frequency induction winding 100, for example having a frequency of 50 kHz. The electric field thus created produces by the effect of eddy currents a substantial heating in a dissipator, termed susceptor, 101 formed by a metal plate. The latter is carried by a support 102 and inclined in such manner as to decrease the angle of incidence of the gases impinging on the substrate placed on the suspector. The dimensions of the metal plate are sufficient to enable substrates of large area to be placed on the susceptor. The current in the winding 100 is set in such manner as to obtain a temperature of 350° C. to 700° C. in the susceptor 101. The optimum temperature of the substrate to be epitaxied is of the order of 500° C.

The pumping means comprise a primary vacuum type pump preceded by a molecular sieve trap. The capacity of the pump is of the order of 100 m³/hour.

Connected to the reactor 10 are two gas supply lines namely a supply line 21 at the entrance of the pyrolysis chamber 11, and consequently opposite to the epitaxy chamber 12, and another supply line 22 at the entrance of the chamber 12. The supply line 21 receives the phosphine (PH₃) through a flow meter 212 provided with a valve 211.

Converging onto the supply line 22 are: the hydrogen supply line 23, the nitrogen supply line 24 and a supply line 25 for a mixture of hydrogen and triethyl indium.

The nitrogen passes through a flow meter 34 provided with a valve 33.

The hydrogen is supplied on one hand through a flow meter 32 provided with a valve 31 connected to the supply line 23, and on the other hand, through a flow meter 36 provided with a valve 35 connected to a supply line 26 immersed to the bottom of a tank containing triethyl indium at the temperature of 20° C. from which the supply line 25 extends.

By way of example, the flows are the following in respect of an epitaxy chamber whose cylindrical part has a diameter of 5 cm:

$PH_3$: 0.1 liter/minute;
$H_2$ (principal): 5 liters/minute;
$H_2$ bubbling in $In(C_2H_5)_3$: 1 liter/minute;
$N_2$: 3 liters/minute.

In general, the flow of P $H_3$ should be 1/10 of the flow of the principal hydrogen, the flow of triethyl indium being regulated by a saturation of an auxiliary current of hydrogen which should be 1/5 of the principal hydrogen flow, and the flow of nitrogen should be 3/5 of the principal hydrogen flow.

If one were content to introduce into the reactor pure hydrogen, phosphine and triethyl indium one could not avoid the pollution of the epitaxy by the product of the reaction (2), that is to say, triethyl indium on the phosphine which escapes from the pyrolysis, since the latter strictly does not reach an efficiency of 100%.

A successful attempt has been made to slow down this troublesome reaction by mixing nitrogen with the hydrogen so as to decrease the partial pressures of the other gases and increase their speed of passage on the substrate to be epitaxied.

For a flow of nitrogen at 30 to 70% of the total flow of nitrogen and hydrogen (the partial pressure of $PH_3$ and $In (C_2H_5)_3$ being negligible), there is observed a practically complete absence of pollution of the epitaxy. The nitrogen may be replaced by any other inert gas.

The results are particularly good when the mean pressure of the gases in the reactor is of the order of 76 Torrs. At this total pressure, the partial pressure of the phosphorus vapour is sufficient to guarantee a good yield of InP, without reaching values for which the gases circulate too slowly. At pressures close to atmospheric pressure, there is indeed produced nucleations in the gaseous phase which results in the formation of smoke and pollution of the epitaxial layers.

If the process according to the invention is compared with more conventional epitaxy methods in a liquid phase (using indium and phosphorous) or in a gaseous phase (using indium and P $Cl_5$), the following advantages are observed:

As concerns the quality of the layer, the transition between the substrate and the epitaxial layer is more sudden and the same is true if a plurality of epitaxial layers are produced with different dopings.

As concerns the dimensions of the surface areas obtained, the process according to the invention lends itself well to the obtainment of large areas. Indeed, epitaxy in a liquid phase is limited to very small areas in crucibles employed with kilns of usual dimensions and these areas could not be increased without the use of very large and expensive kilns. As concerns epitaxy in a vapour phase by the halide method, it is produced only in a well-defined zone where the temperature gradient has a definite value, which results in a limitation of the area of the epitaxied layers. In contrast to this, in the process according to the invention, the epitaxy can occur throughout the length and throughout the width of the tubular part of the epitaxy chamber, the conditions of pressure and flow of the gases being achieved simultaneously throughout this length.

What is claimed is:

1. A process for the gas-phase production of an epitaxial layer of indium phosphide which comprises:

preforming a gas containing phosphorous vapor by pyrolyzing phosphine in the gas phase at 700° C.–1000° C. according to equation (1):

$$4 PH_3 \rightarrow P_4 + 6 H_2 \quad (1)$$

introducing said preformed gas stream containing phosphorous vapor into a mixing chamber;

separately introducing into said chamber a mixture comprising nitrogen, hydrogen, and triethyl indium; thereby reacting said phosphorous in said gas stream with said triethyl indium in said chamber in the presence of a substrate of monocrystalline InP at 350°–700° C., according to equation (2):

$$3/2\ H_2 + \tfrac{1}{4} P_4 + In(C_2H_5)_3 \rightarrow InP + 3\ C_2H_6 \quad (2).$$

2. A process for the gas phase production of an epitaxial layer of indium phosphide which comprises:

preforming a gas stream containing phosphorous vapor by pyrolyzing phosphine in the gas phase at 700° C–1000° C. according to equation (1):

$$4 PH_3 \rightarrow P_4 + 6 H_2 \quad (1)$$

introducing said preformed gas stream containing phosphorous vapor into a mixing chamber;

separately introducing into said chamber a mixture comprising nitrogen, hydrogen, and triethyl indium; thereby reacting said phosphorous in said gas stream with said triethyl indium in said chamber in the presence of a substrate of monocrystalline InP at 350°–700° C., according to equation (2):

$$3/2\ H_2 + \tfrac{1}{4} P_4 + In(C_2H_5)_3 \rightarrow InP + 3\ C_2H_6 \quad (2)$$

wherein the partial pressure of nitrogen gas is 30–70% of the total pressure of nitrogen and hydrogen.

3. A process as claimed in any of claims 1 or 2 wherein the total mean pressure of the gases and vapors is between 10 Torrs and atmospheric pressure.

4. A process as claimed in claim 3, wherein the total pressure of the gases and vapour is between 70 and 80 Torrs.

5. A process as claimed in claim 4, wherein the total mean pressure in the reaction zone is 76 Torrs.

6. A process as claimed in any of claims 1 or 2, wherein the steps occur in succession in a pyrolysis chamber and an epitaxy chamber of the same reactor, the flow of $PH_3$ being 1/10 of the flow of principal hydrogen, the flow of triethyl indium being regulated by saturation of an auxiliary current of hydrogen which is 1/5 of the principal hydrogen flow, and the flow of nitrogen being 3/5 of the principal hydrogen flow.

* * * * *